United States Patent
Fletcher et al.

(10) Patent No.: US 11,366,779 B2
(45) Date of Patent: Jun. 21, 2022

(54) SYSTEM-IN-PACKAGE ARCHITECTURE WITH WIRELESS BUS INTERCONNECT

(71) Applicants: Arm Limited, Cambridge (GB); ECS Partners Limited, Southampton (GB)

(72) Inventors: Benjamin James Fletcher, Burwell (GB); James Edward Myers, Bottisham (GB); Shidhartha Das, Upper Cambourne (GB); Terrence Sui Tung Mak, Basingstoke (GB)

(73) Assignees: Arm Limited, Cambridge (GB); ECS Partners Limited, Southampton (GB)

( * ) Notice: Subject to any disclaimer, the term of this patent is extended or adjusted under 35 U.S.C. 154(b) by 0 days.

(21) Appl. No.: 16/685,090

(22) Filed: Nov. 15, 2019

(65) Prior Publication Data

US 2021/0149834 A1     May 20, 2021

(51) Int. Cl.
*G06F 13/40* (2006.01)
*H04L 12/40* (2006.01)

(52) U.S. Cl.
CPC .... *G06F 13/4027* (2013.01); *H04L 12/40019* (2013.01)

(58) Field of Classification Search
CPC ........................ G06F 13/4027; H04L 12/40019
See application file for complete search history.

(56) References Cited

U.S. PATENT DOCUMENTS

| | | | |
|---|---|---|---|
| 6,956,510 B1 | 10/2005 | He et al. | |
| 9,432,298 B1 * | 8/2016 | Smith | H04L 49/9057 |
| 2004/0110519 A1 | 6/2004 | Chang et al. | |
| 2008/0160931 A1 | 7/2008 | Rofougaran | |
| 2009/0245445 A1 * | 10/2009 | Saen | H01L 25/0657 375/354 |
| 2013/0026655 A1 * | 1/2013 | Lee | H01L 23/13 257/777 |
| 2013/0181534 A1 * | 7/2013 | Jin | H01L 23/64 307/104 |
| 2013/0221470 A1 * | 8/2013 | Kinsman | H01L 27/14618 257/434 |

(Continued)

OTHER PUBLICATIONS

X_ Liao, J_ Zhou and X. Liu, "Exploring AMBA AXI on-Chip interconnection for TSV-based 3D Socs," 2011 IEEE International 3D Systems Integration Conference (3DIC), 2011 IEEE International, Osaka, 2012, pp. 1-4. (Year: 2012).*

(Continued)

*Primary Examiner* — Idriss N Alrobaye
*Assistant Examiner* — Ronald T Modo
(74) *Attorney, Agent, or Firm* — Leveque Intellectual Property Law, PC (57) ABSTRACT

A chip-carrier package includes a data processing system having one or more slave dies, a master die and a system bus. Each slave die includes a slave device and a slave-side wireless bus interface (WBI) coupled to the slave device. The master die includes a master device, one or more bus-side WBIs coupled to the master device. Each bus-side WBI is configured to be wirelessly coupled to at least one slave-side WBI of the one or more slave dies and a system bus. The system bus includes the one or more bus-side WBIs and the slave-side WBIs of the one or more slave-side dies. The system bus is configured to exchange information between the master device and the slave devices of the one or more slave dies.

15 Claims, 10 Drawing Sheets

(56) References Cited

U.S. PATENT DOCUMENTS

| | | | |
|---|---|---|---|
| 2017/0288741 A1 | 10/2017 | Zhu et al. | |
| 2019/0074914 A1 | 3/2019 | Hueber et al. | |
| 2019/0347417 A1* | 11/2019 | Tehranipoor | G06F 21/568 |
| 2020/0280220 A1* | 9/2020 | Ettes | H02J 50/12 |

OTHER PUBLICATIONS

M. Matsuo, T. Ohtsuki and I. Sasase, "Rate-adaptive indoor infrared wireless communication systems using punctured convolutional codes and adaptive PPM," Ninth IEEE International Symposium on Personal, Indoorand Mobile Radio Communications (Cat. No.98TH8361), Boston, MA, USA, 1998, pp. 693-697.

N.J. August, R. Thirugnanam and Dong Sam Ha, "An adaptive UWB modulation scheme for optimization of energy, BER, and data rate," 2004 International Workshop on Ultra Wideband Systems Joint with Conference on Ultra Wideband Systems and Technologies. Joint UWBST & IWUWBS 2004 (IEEE Cat. No.04EX812), Kyoto, Japan, 2004, pp. 182-186.

S. S. Ameer Abbas, P. Vishnoo Priyaa and A. Vinitha, "A Novel Approach for Better Throughput in Near Field Communication Built by Ternary QAM using Tanner Tool," 2019 International Conference on Communication and Signal Processing (ICCSP), Chennai, India, 2019, pp. 0572-0576.

I.A. Papistas and V. F. Pavlidis, "Efficient Modeling of Crosstalk Noise on Power Distribution Networks for Contactless 3-D ICs," in IEEE Transactions on Circuits and Systems I: Regular Papers, vol. 65, No. 8, pp. 2547-2558, Aug. 2018.

Jian Xu, J. Wilson, S. Mick, Lei Luo and P. Franzon, "2.8 Gb/s inductively coupled interconnect for 3D ICs," Digest of Technical Papers. 2005 Symposium on VLSI Circuits, 2005., Kyoto, Japan, 2005, pp. 352-355.

K. Ueyoshi et al., "QUEST: A 7.49TOPS multi-purpose log-quantized DNN inference engine stacked on 96MB 3D SRAM using inductive-coupling technology in 40nm CMOS," 2018 IEEE International Solid—State Circuits Conference—(ISSCC), San Francisco, CA, 2018, pp. 216-218.

M. Saito, N. Miura and T. Kuroda, "A 2Gb/s 1.8pJ/b/chip inductive-coupling through-chip bus for 128-Die NAND-Flash memory stacking," 2010 IEEE International Solid-State Circuits Conference—(ISSCC), San Francisco, CA, 2010, pp. 440-441.

N. Miura, D. Mizoguchi, M. Inoue, T. Sakurai and T. Kuroda, "A 195-gb/s 1.2-W inductive inter-chip wireless superconnect with transmit power control scheme for 3-D-stacked system in a package," in IEEE Journal of Solid-State Circuits, vol. 41, No. 1, pp. 23-34, Jan. 2006.

S. Han and D. D. Wentzloff, "Wireless power transfer using resonant inductive coupling for 3D integrated ICs," 2010 IEEE International 3D Systems Integration Conference (3DIC), Munich, 2010, pp. 1-5.

T. Zhang et al., "A 3D SoC design for H.264 application with on-chip DRAM stacking," 2010 IEEE International 3D Systems Integration Conference (3DIC), Munich, 2010, pp. 1-6.

X. Liao, J. Zhou and X. Liu, "Exploring AMBA AXI on-Chip interconnection for TSV-based 3D SoCs," 2011 IEEE International 3D Systems Integration Conference (3DIC), 2011 IEEE International, Osaka, 2012, pp. 1-4.

Kuroda, "Inductive coupling transceivers for inter-chip data communication," 2009 IEEE International Symposium on Radio-Frequency Integration Technology (RFIT), Singapore, 2009, pp. 13-15.

* cited by examiner

SYSTEM-IN-PACKAGE ARCHITECTURE WITH WIRELESS BUS INTERCONNECT

BACKGROUND

The present disclosure relates to wireless communication between semiconductor dies in three-dimensional (3D) chip-carrier packages.

3D integration of semiconductor dies increases device density within integrated circuits by extending the dies vertically. Mostly, 3D integration is achieved using through-silicon vias (TSVs) to vertically connect stacked layers. A via is a small opening through insulating layers that may be filled with copper or other conducting material, for example, before the devices are stacked.

When TSVs are used, customization of packaged system, to use different peripheral devices for example, incurs undesired costs for design, manufacture and test.

BRIEF DESCRIPTION OF THE DRAWINGS

The accompanying drawings provide visual representations which will be used to more fully describe various representative embodiments and can be used by those skilled in the art to better understand the representative embodiments disclosed and their inherent advantages. In these drawings, like reference numerals identify corresponding or analogous elements.

DETAILED DESCRIPTION

The various apparatus and devices described herein provide mechanisms for providing a system bus that spans multiple semiconductor dies using wireless communication between the dies.

While this present disclosure is susceptible of embodiment in many different forms, there is shown in the drawings and will herein be described in detail specific embodiments, with the understanding that the embodiments shown and described herein should be considered as providing examples of the principles of the present disclosure and are not intended to limit the present disclosure to the specific embodiments shown and described. In the description below, like reference numerals are used to describe the same, similar or corresponding parts in the several views of the drawings. For simplicity and clarity of illustration, reference numerals may be repeated among the figures to indicate corresponding or analogous elements.

An architecture is disclosed for a data processing system implemented as two or more components packaged together. The system includes a system bus that is distributed across the packaged components using wireless communication. For example, the system bus enables a master device on one semiconductor die to communicate with a slave device on another semiconductor die. This approach enables a wireless bus slave to be fabricated using a different process technology, such as microelectromechanical engineering, to the bus master device. For example, a slave device could be designed or manufactured by a separate vendor using a different process technology, yet still couple to a master device through a specified wireless clock and data interface.

Three-dimensional (3D) integration of semiconductor dies provides a method for increasing device density within integrated circuits by extending them vertically. Presently, most 3D integration uses through silicon vias (TSVs) to interconnect vertically stacked layers. The vias may be filled with copper, for example, before the devices are stacked.

Wireless technology provides an alternative to TSVs for 3D integration, where multiple stacked silicon dies communicate data wirelessly with one another through near-field, inductive or capacitive coupling. Inductance-coupled 3D integration may provide increased communication distances compared to capacitance-coupled integration.

An embodiment of the disclosure relates to a chip-carrier package including a slave die, a semiconductor die, which may be fabricated using different technologies. The slave die includes a slave-side wireless bus interface (WBI), while the master integrated circuit die includes a bus, a bus-side WBI coupled to a master device. The bus-side WBI is capable of being wirelessly coupled to the slave-side WBI. The master device is configured to exchange information with the slave die through the bus-side WBI and the slave-side WBI. The slave die may include, for example, a sensor, a memory, a peripheral device or a processor.

The bus-side WBI and slave-side WBI may communicate using one or more inductors, one or more capacitors, or a combination thereof. For example, the bus-side WBI may include a transmitter inductor, a bus-side controller coupled to the bus and a transmission circuit coupled to the transmitter inductor and the bus-side controller. The transmission circuit may be configured to supply a modulation signal to the transmitter inductor based on a data signal received from the master device via the bus-side controller. Similarly, the slave-side WBI may include a receiver inductor, a reception circuit, coupled to the receiver inductor and a slave-side controller, coupled to the reception circuit and a slave device. The slave-side controller is configured to supply received information to the slave device or a control register of the slave-side WBI. The reception circuit is configured to demodulate and decode an electrical signal induced in the receiver inductor to generate the received information.

In addition, the bus-side WBI may include a clock transmitter inductor, and a clock transmission circuit, coupled to the clock transmitter inductor. The clock transmission circuit is configured to supply an electrical current to the clock transmitter inductor responsive to a clock signal. The slave-side WBI includes a corresponding clock receiver inductor, a clock receiver circuit, coupled to the clock receiver inductor. The clock receiver circuit being configured to generate a received clock signal based on an electrical current induced in the clock receiver inductor.

The master integrated circuit die may be configured to supply power to the slave die via the transmitter inductor or the clock inductor.

On operation, the bus-side WBI establishes a wireless communication channel between the bus-side WBI and the slave-side WBI, receives data from a master device of the semiconductor die and sends the data to the slave-side WBI via the wireless communication channel. The data may be received via an integrated bus coupled to the bus-side WBI and the master device.

A wireless communication channel may be established by sending a configuration message to the slave-side WBI via the wireless transmission channel and receiving an acknowledgement of readiness message from the slave-side WBI via the wireless reception channel. The configuration message may include an information packet based on one or more values in a control register of the bus-side WBI.

The bus-side WBI may receive, from the master device, a control signal to supply electrical power to the slave die.

Figure 1:
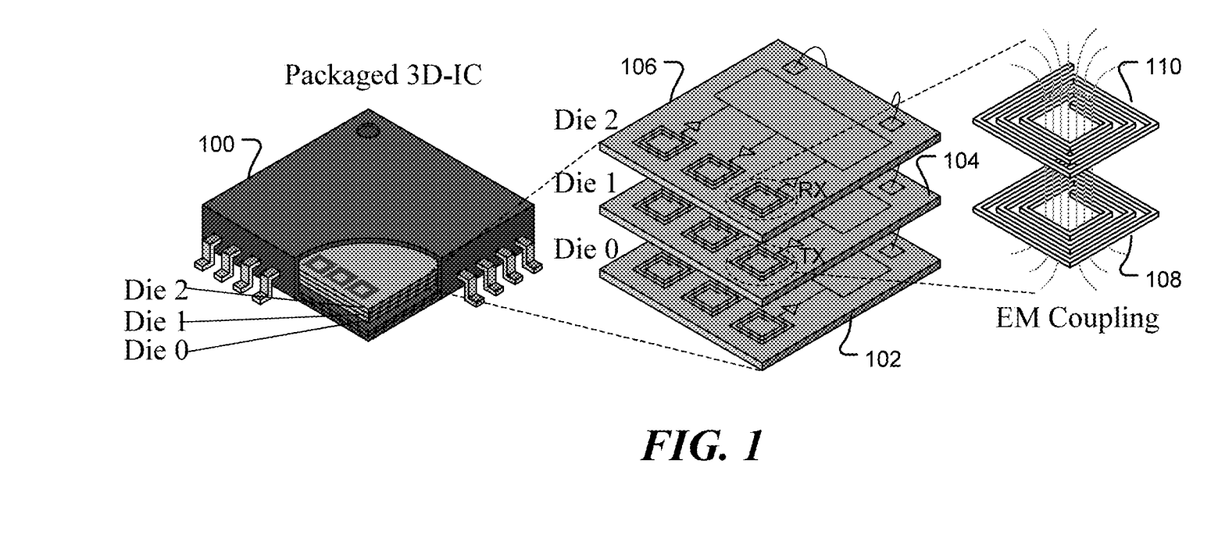
FIG. 1 is a diagrammatic representation of three-dimensional (3D) integration of semiconductor dies in a package using inductively coupled interconnects, in accordance with various representative embodiments.

FIG. 1 is a diagrammatic representation of 3D integration of semiconductor dies in a package 100 using inductively coupled interconnects, in accordance with the present disclosure. In the embodiment shown, package 100 contains semiconductor dies 102, 104 and 106. The semiconductor dies are interconnected by wireless communications channels. For example, semiconductor die 104 includes a transmitting (TX) inductor 108 that produces an electromagnetic (EM) field intersected by a corresponding receiving (RX) inductor 110 of semiconductor die 106. The inductors may comprise planar coils, for example, fabricated in the upper back-end-of-line or metallization interconnect layer of the semiconductor die. Vertical communication is achieved by encoding data in a series of current pulses that are fed through TX inductor 108 on semiconductor die 104. These current pulses generate a magnetic field that is intersected by corresponding RX inductor 110, fabricated in slave die 106. The magnetic field induces a corresponding current in the RX inductor. A voltage derived from the induced current is detected and the data stream or clock signal is recovered. An inductively coupled interconnect can also be used to deliver power between tiers. For example, a received alternating voltage may be rectified and regulated. A tier in the vertical stack may contain a single die or multiple dies arranged horizontally. A stack may have two or more tiers.

Figure 2:
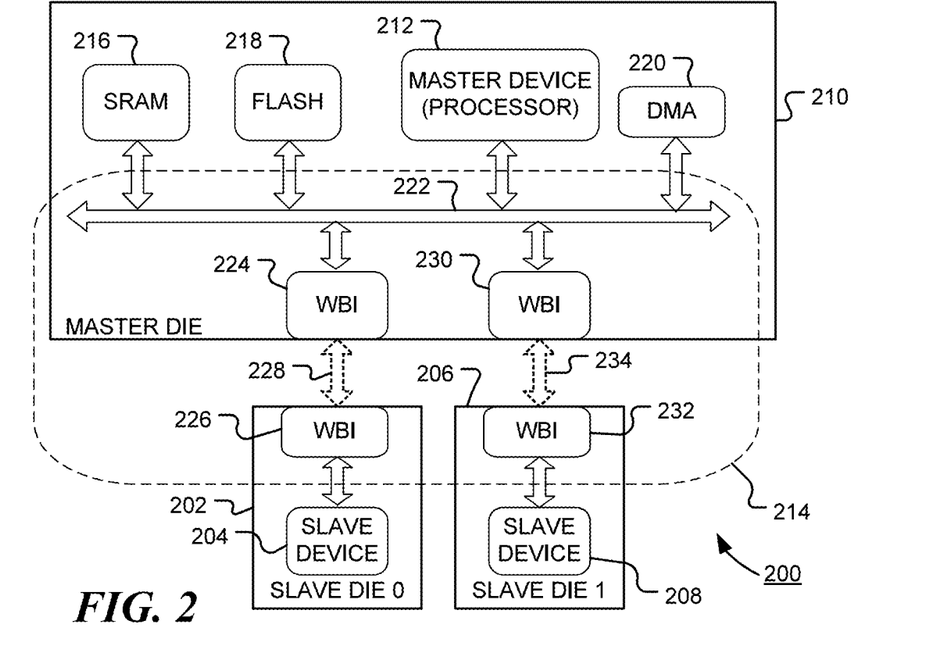
FIG. 2 is a block diagram of a system-in-package (SiP) architecture, in accordance with various representative embodiments.

FIG. 2 is a simplified block diagram of a system-in-package (SiP) architecture 200 for a data processing system, in accordance with embodiments of the disclosure. In the example shown in FIG. 2, slave die 202 includes one or more bus slave devices 204 and slave die 206 includes one or more bus slave devices 208. Master integrated circuit die 210 functions as a digital master system in which slave devices 204 and 208 communicate with a master device 212, such as a processor, via a system bus 214. In the example shown, master integrated circuit die 210 also includes static random access memory (SRAM) 216, flash memory 218 and direct memory access (DMA) controller 220. These components are coupled via integrated bus 222 that enables transfer of signals on data, address and control lines.

Transfer of information between master device 212 and slave device 204 is enabled using bus-side wireless bus interface (WBI) 224 that interacts with corresponding slave-side WBI 226 to form wireless communication link 228. Similarly, transfer of information between master device 212 and slave device 208 is enabled using bus-side WBI 230 that interacts with corresponding slave-side WBI 232 to form wireless communication link 234. When packaged in a chip-carrier package, inductors in bus-side WBI 224 are aligned with corresponding inductors in slave-side WBI 226 and inductors in bus-side WBI 230 are aligned with corresponding inductors in slave-side WBI 232.

Bus-side WBIs 224 and 230 and slave-side WBIs 226 and 232, together with integrated bus 222, provide system bus 214 for the SiP data processing system 200. Slave devices 204 and 208 are examples of devices that, even though they exist as separate physical components, can be addressed on system bus 206. As such, SiP data processing system 200 functions as an integrated system.

It will be apparent to those of skill in the art that a SiP data processing system may include two or more master integrated circuit dies wirelessly coupled via bus-side WBIs in each die. Further, it will be apparent that a SiP data processing system may include any number of slave dies. Still further, it will be apparent that any die in the package may contain any number or combination of slave and master devices.

The use of WBIs, as disclosed herein, enables a system bus to be distributed across multiple dies in a chip-carrier package to form a functionally integrated data processing system.

Using this approach, wireless slave devices can be interchanged to form customized variations of a single product. For example, without hardware modification, the same digital master system could be stacked with different sensor dies (each incorporating the wireless bus interface), to provide a range of different products. In addition, proprietary bus slaves may be self-contained, minimizing the opportunity for side-channel attacks. Slave devices can be addressed directly and seamlessly using the system bus, even though they may be fabricated using different process technologies or may operate at different supply voltages. In this way, a wireless bus interconnect enables 3D SiPs to be realized without incurring the design, manufacture and testing costs associated with TSV-based 3D integration. Also, a wireless bus interconnect facilitates strong power management of slave devices, since the bus master can enable or disable power to the entire wireless slave device through the wireless bus interconnect.

Figure 3:
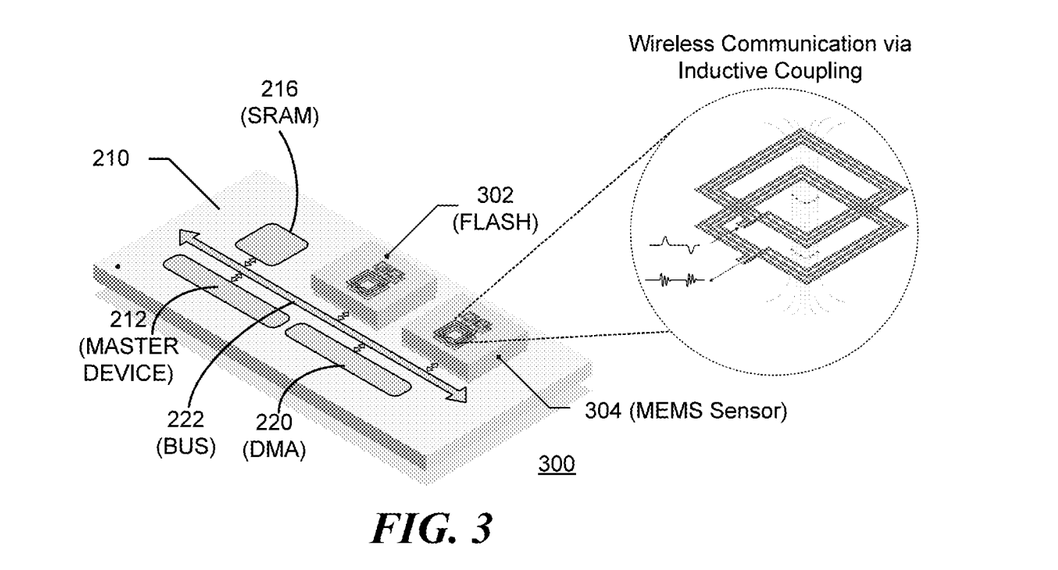
FIG. 3 is a further block diagram of a SiP architecture, in accordance with various representative embodiments.

FIG. 3 illustrates a system-in-package (SiP) architecture 300, in accordance with various embodiments, in which two separate bus slaves, 302 (flash memory) and 304 (sensor), are connected wirelessly to integrated bus 222. Here, wireless connection is realized using a near-field inductively coupled interconnect. In the example shown in FIG. 3, the wireless slaves take the form of microelectromechanical system (MEMS) sensor 304, and flash chip 302 that are stacked above master integrated circuit die 210. Master integrated circuit die 210 includes master device 212 (such as a processor or CPU), static random access memory (SRAM) 216, and direct memory access (DMA) controller 220. These components are coupled via integrated bus 222. Other slave devices (not shown in FIG. 3) may be used without departing from the present disclosure. Using this approach, slave dies, such as memory die 302 and sensor die 304, can be selected based upon a target application (e.g. an ultrasonic MEMS transducer for healthcare applications, or a MEMS radar for automotive applications) and the same base processor system can be reused between these applications.

Each bus-side WBI provides the analog transceiver circuits and inductors required to form an inductively-coupled wireless link. In addition, the bus-side WBI implements the digital control logic that provides access to the bus through a standard bus protocol. The bus-side WBI also contains a control register file to maintain the configuration/status of the wireless interface.

Figure 4:
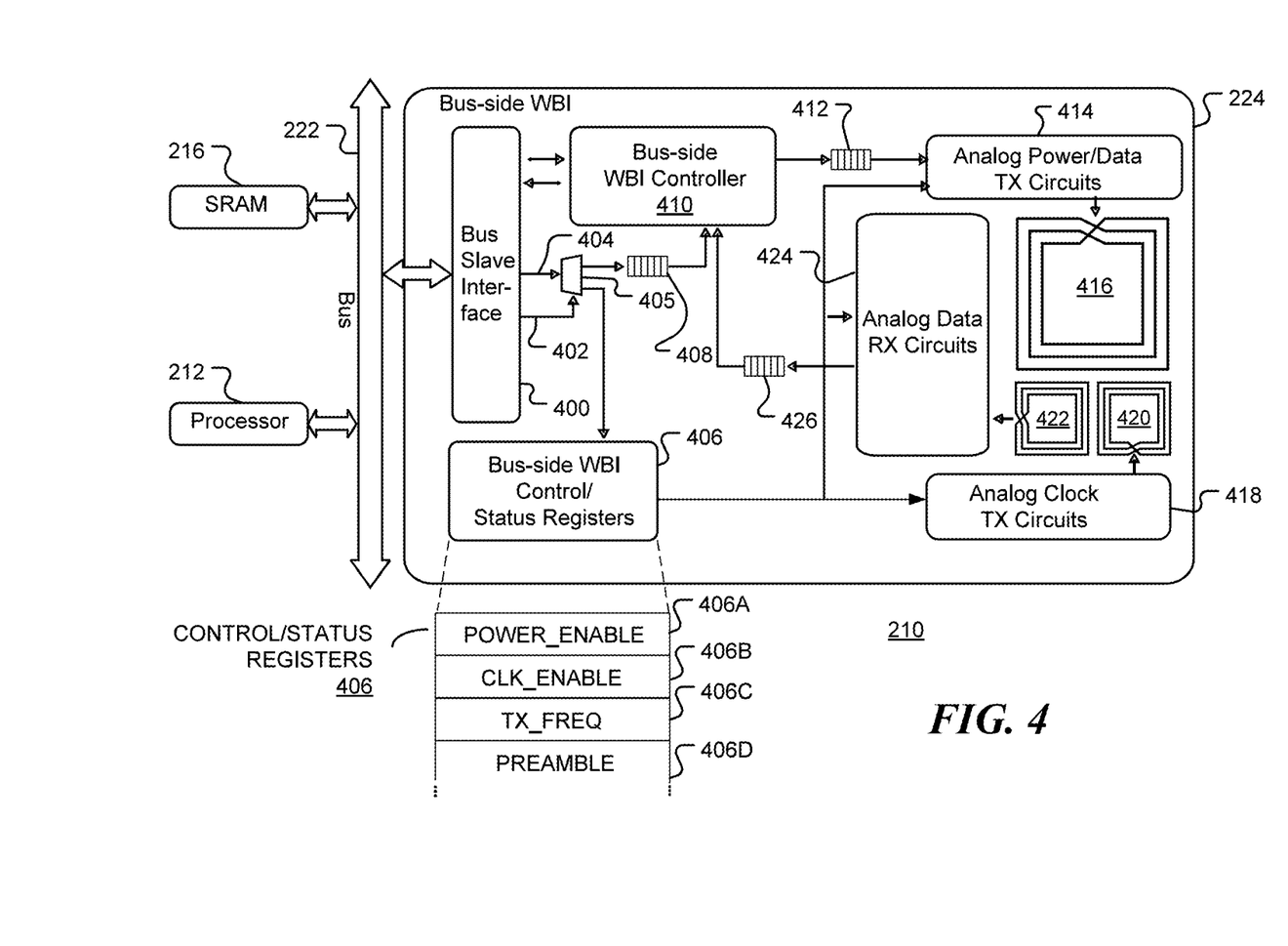
FIG. 4 is a block diagram of an example of a bus-side wireless bus interface (WBI) of a master integrated circuit die, in accordance with various representative embodiments.

FIG. 4 shows an example of a bus-side WBI 224 of master integrated circuit die 210, in accordance with various embodiments. Bus-side WBI 224 is configured to establish a wireless connection between an external slave device and integrated bus 222 that, in this example, is coupled to processor 212 and SRAM 216. Bus-side WBI 224 includes bus slave interface 400 that is coupled to integrated bus 222 and routes bus messages to the bus-side WBI 224. A message may include write address 402 and write data 404. The write address 402 is used in switch 405 to route the data to bus-side WBI control/status registers 406 or to transmission buffer 408, which may be a FIFO (first-in, first-out) buffer. Control/status registers 406 may include, for example, power-enable register 406A, clock-enable register 406B, transmission frequency (TX FREQ) register 406C and packet preamble register 406D. Write data from control/status registers, which may also be a buffer, 406 is passed to bus-side WBI controller 410. WBI Controller 410 assembles a packet, with the structure shown in FIG. 6 for example, by prepending preamble, packet type, and data length bits to the write address and write data bits. The preamble may be controlled by the master device writing to preamble register 406D, for example. If the bus speed is slower than the wireless link frequency, the FIFOs shown on FIG. 4 and FIG. 5 can be used as buffers. Once the packet has been assembled, it is transmitted (preamble first) via FIFO 412 and analog data transmission circuit 414 to transmitting inductor 416. Analog data transmission circuit 414 may use phase-shift keying, for example, to provide a modulation signal, based on the packet to be transmitted, for driving transmitting inductor 416.

Analog clock circuit 418 is configured to drive clock inductor 420 in order to provide a clock signal to the slave device. The clock signal may be used for bit and/or packet synchronization. The clock signal may be controlled, for example, by a master device writing to clock enable register 406B and to transmission frequency register 406C.

Power to the slave device may be transmitted using transmitting inductor 416 or clock inductor 420. Supply of power may be controlled by a master device by writing to power enable register 406A, for example.

An electrical current is induced in receiving inductor 422 by an electromagnetic field produced by a transmitting inductor of the slave device. The current may be amplified and demodulated in analog receiving circuit 424 to provide received packet data that is buffered in receive buffer 426 and passed to bus-side WBI controller 410. The received packet data is decoded by bus-side WBI controller 410 and passed to system bus 222 via bus slave interface 400.

The example shown in FIG. 4 utilizes three wireless channels. A data transmission channel is formed using inductor 416, a clock transmission channel is formed using inductor 420, and a data reception channel is formed using inductor 422. Power may be transmitted using transmission inductor 416 or clock inductor 422, in which case the selected inductor may be physically larger.

Figure 5:
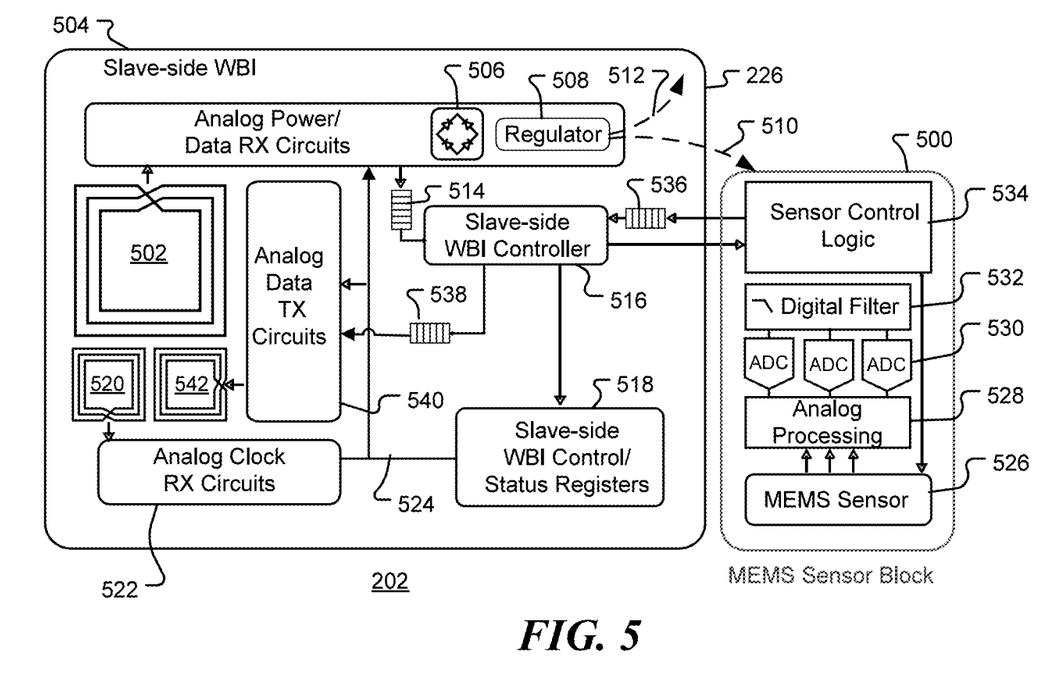
FIG. 5 is a block diagram of an example of a slave-side WBI, in accordance with various representative embodiments.

FIG. 5 shows an example of the structure of a slave die 202 that includes slave-side WBI 226 and a slave device, in accordance with various embodiments. In this example, the slave device is a MEMS sensor block 500, however, the slave die may contain a different slave device or multiple slave devices. In the example shown slave-side WBI 226 is coupled directly to MEMS sensor block 500. A current induced in receiving inductor 502 is demodulated and decoded in receiver (RX) circuit 504. A voltage produced from the induced current may be rectified in rectifier 506 and regulated in regulator 508 to provide power 510 and 512 for the MEMS sensor block 500 and the slave-side WBI 220 (not shown in FIG. 5), respectively. When the slave device recognizes the phase shift pattern corresponding to the preamble in the received signal (signaling the start of the transmission), the wireless bus slave begins to store the packet in receiving FIFO 514. Once the full packet has been received, it is decoded by slave-side WBI controller 516. If the request is a write request, the request action is performed in the slave device. For example, data may be written to one of the slave-side WBI status and control registers 518 or passed to a slave module such as MEMS sensor block 500.

A clock signal may be received via clock inductor 520 and passed to clock receive circuit 522 to generate a clock signal 524 for use by the slave device 518.

In the example shown in FIG. 5, MEMS sensor block 500 includes MEMS sensing elements 526. Signals produced by the sensing elements are conditioned in analog processing circuits 528 and digitized in analog-to-digital converters (ADCs) 530. After digital processing in circuit 532 (such as digital filtering), the sensor data are passed via sensor control logic 534 and buffer 536, the slave-side WBI controller 516. Here, the data are formed into packets and passed, via buffer 538, to analog data transmission (TX) circuit 540. Here, an analog modulation signal is generated, based on the packet data. The analog modulation signal is used to drive transmission inductor 542 to transmit the data to the master device. Thus, through use of the wireless bus interconnect, the slave device functions as bus slave device on the system bus.

Figure 6:
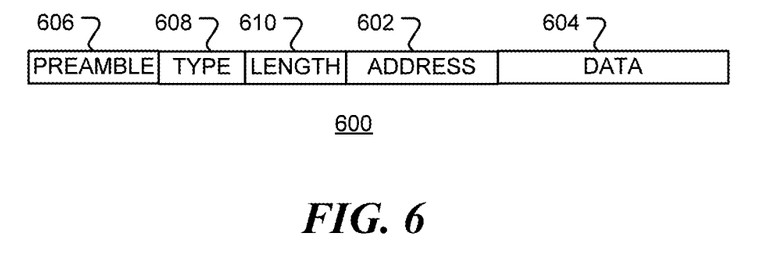
FIG. 6 shows an example structure of a transmission packet for transmission across a wireless inductively-coupled interconnect, in accordance with various representative embodiments.

FIG. 6 shows an example structure 600 of a TX packet sent across the wireless inductively-coupled interface, in accordance with embodiments of the disclosure. The packet is formed, from address bits 602 and data bits 604, by prepending preamble 606, packet type indicator 608, and data length bits 610. Preamble pattern 606 may used to distinguish the start of the useful data (compared, for example, with an idle sinusoid used to deliver power between dies, for example). In an alternative embodiment, the clock signal is used to distinguish the start of a packet of frame.

Figure 7:
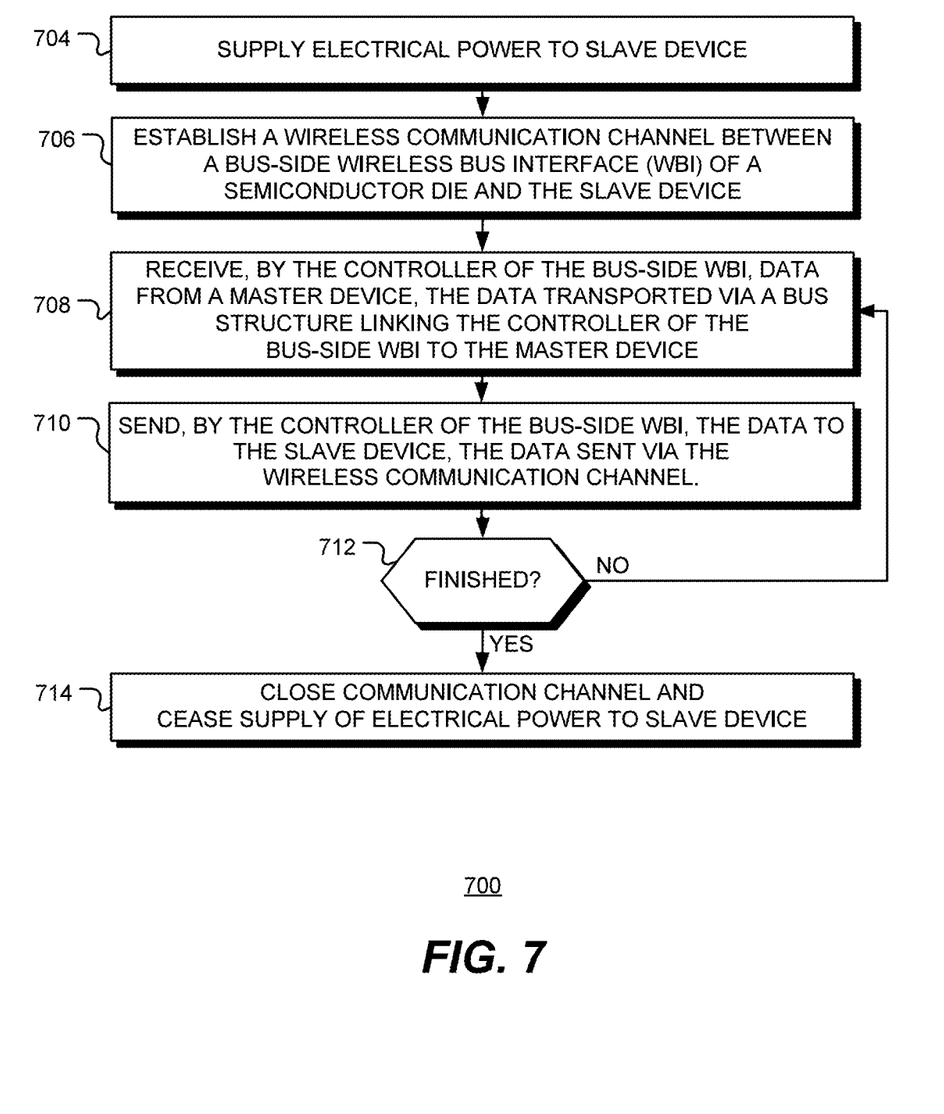
FIG. 7 shows a method for wireless coupling of a slave device to a system bus, in accordance with various representative embodiments.

FIG. 7 shows a method 700 for coupling a slave device to a system bus. Electrical power is supplied to the slave device at block 704 and a wireless communication channel is established between a wireless bus interface (WBI) of a master integrated circuit die and the slave device at block 706. At block 708, a controller of the WBI receives data from a master device. The data is transported to the WBI via a bus structure linking the controller of the WBI to the master device. The bus structure may also carry a destination address for the data. At block 710, the controller of the WBI sends the data to the slave device via the wireless communication channel. If communication with the slave is not finished, as depicted by the negative branch from decision block 712, flow continues to block 708 and the WBI waits for more data from the master device to arrive via the bus. If communication with the slave is finished, as depicted by the positive branch from decision block 712, the wireless communication channel may be closed and the supply of power to the slave device stopped at block 714.

Figure 8:
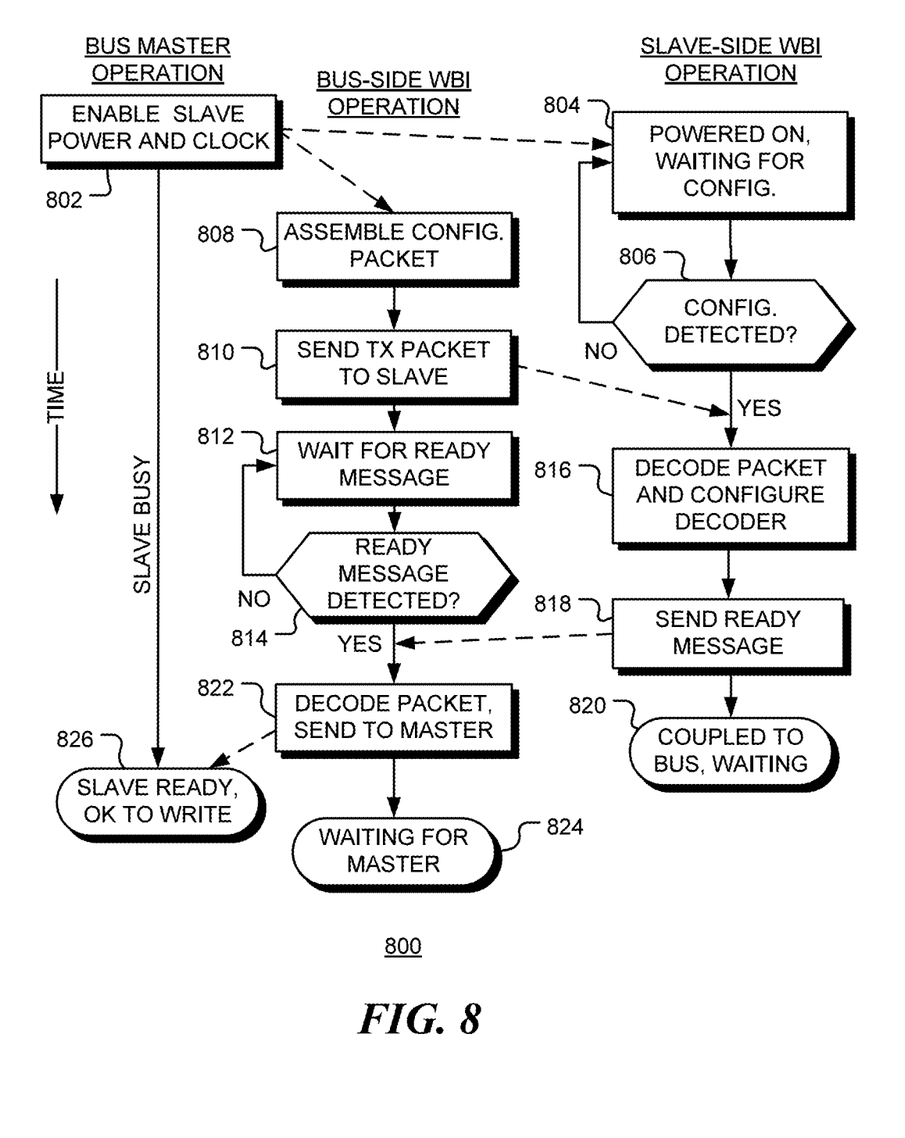
FIG. 8 shows a method for wireless coupling of a slave device to a system bus, in accordance with various representative embodiments.

FIG. 8 shows a method 800 for coupling a slave device to a system bus, in accordance with embodiments of the disclosure. FIG. 8 shows time lines for a bus master device, a bus-side WBI and a slave-side WBI, with time flowing downwards as indicated by the arrow. At block 802, the bus master enables power delivery and clock transmission to the slave device by writing (via the system bus) to WBI control/status registers. This may result in, for example, a sinusoid signal being transmitted through a data transmission channel or the clock transmission channel. The induced signal at the slave device is rectified and regulated to provide power for the wireless peripheral (such as a MEMS sensor).

The slave device is now powered-on and waiting for a transaction to occur, as indicated by block 804 and the negative branch from decision block 806.

At block 808, the bus-side WBI assembles a configuration packet to be sent to the slave device. The configuration may include, for example, channel configuration data such as sample rate or encoding protocol. This information may be stored in the WBI status/control registers and updated by the bus master. At block 810, the configuration packet is sent to the slave device. Initial packets may be sent using a default protocol, for example. The bus-side WBI then waits for a response from the slave device, as indicated by block 812 and the negative branch from decision block 814. When the configuration packet is received by slave-side WBI, as depicted by the positive branch from decision block 806, the packet is decoded and the wireless channel is configured accordingly at block 816. A READY message is then sent, at block 818, from the slave-side WBI to the bus-side WBI. The slave-side WBI is now ready to receive data or commands, as indicated by block 820. When a packet containing the READY message is received by bus-side WBI, as depicted by the positive branch from decision block 814, the packet is decoded and a READY message is sent to the bus master at block 822. The bus-side WBI is now ready to receive data or commands from the bus master, as shown by 824. Receipt of the READY message by the bus master indicates to the bus master that the slave device is coupled to the bus and ready to receive data and commands, as indicated by block 826. The communication channel is now established.

Figure 9:
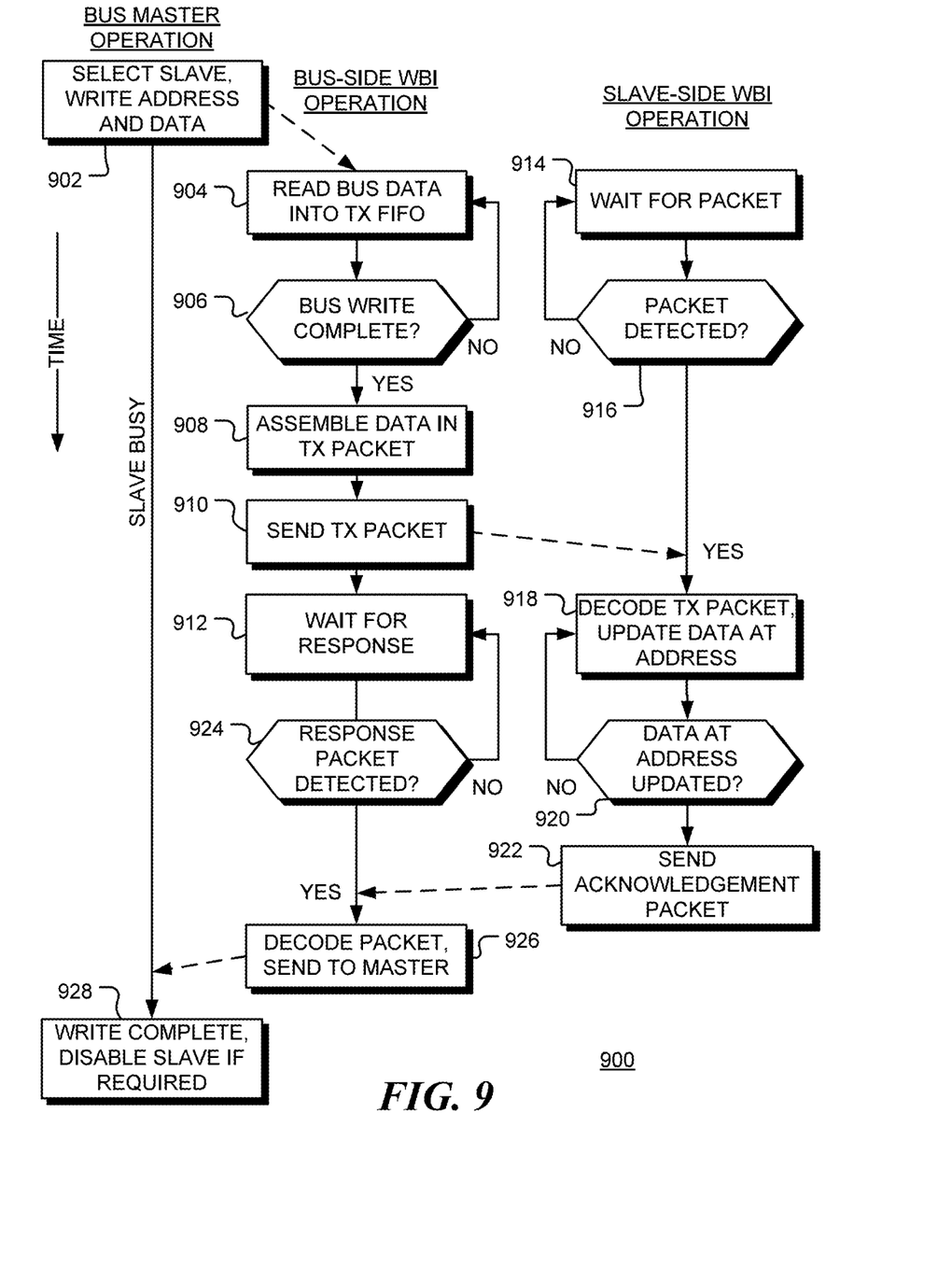
FIG. 9 illustrates a bus write operation from a master device to a wirelessly-coupled slave device, in accordance with various representative embodiments.

FIG. 9 is a flow chart 900 illustrating a bus write operation from a master device to a wirelessly-coupled slave device, in accordance with embodiments of the disclosure. FIG. 9 shows time lines for a bus master device, a bus-side WBI and a slave-side WBI, with time flowing downwards as indicated by the arrow. After a wireless link has been established (as discussed above with reference to FIG. 8), the bus Master can write to the slave device using a standard bus protocol. At block 902, the bus master selects the slave device and sends address and data bits over the bus to the bus-side WBI controller. The WBI controller manages any protocol signaling, such as a handshake. The bits may be buffered by the WBI controller at block 904. When all of the information has been received, as depicted by the positive branch from decision block 906, the WBI controller assembles, at block 908, a packet (with the structure shown in FIG. 6, for example) by prepending the preamble, packet type, and data length bits to the address and data bits. Once the packet has been assembled, it is transmitted (preamble first) through the inductively-coupled link using phase-shift keying at block 910. The bus-side WBI then waits for a response from the slave device at block 912.

Following configuration of the wireless communication channel, the slave-side waits for packets from the bus-side WBI, as indicated by block 914 and the negative branch from decision block 916. When, as indicated by the positive branch from decision block 916, the slave-side WBI recognizes a preamble, such as phase shift pattern, in the received signal (indicating the start of the transmission), the slave-side WBI begins to store the packet in a receive buffer and to decode it at block 918. Once the full packet has been decoded, the requested write operation is performed in the slave device. When the write operation is complete, as depicted by the positive branch from decision block 920, the slave-side WBI transmits an acknowledgement packet to the bus-side WBI through the wireless communication link at block 922. When the acknowledgement packet is received by the bus-side WBI, as depicted by the positive branch from decision block 924, the packet is decoded and the acknowledgement is forwarded to the bus master at bock 926. Once this acknowledgement has been received by the bus master, the WBI may assert a bus READY signal, indicating that it is ready for further transactions. At this point, the write operation is complete, and the wireless slave peripheral can safely be powered-off, if desired, as indicated by block 928.

It will be apparent to those skilled in the art, that bus read operations or other bus transactions may be performed using methods similar to that shown in FIG. 9.

Figure 10:
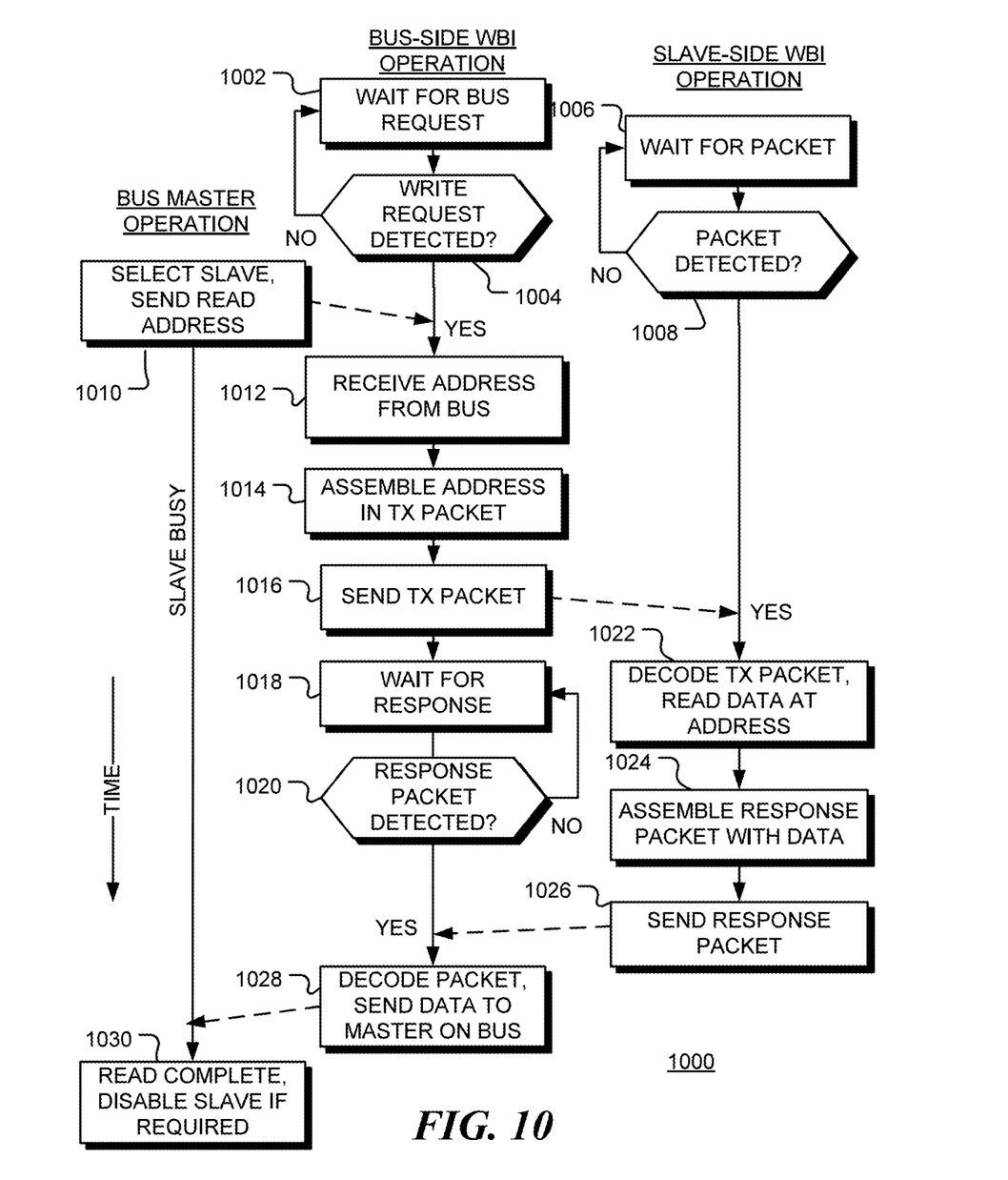
FIG. 10 illustrates a bus read operation by a master device from a wirelessly-coupled slave device, in accordance with various representative embodiments.

FIG. 10 illustrates a bus read operation 1000 by a master device from a wirelessly-coupled slave device, in accordance with various representative embodiments.

FIG. 10 shows time lines for a bus master device, a bus-side WBI and a slave-side WBI, with time flowing downwards as indicated by the arrow. After a wireless link has been established (as discussed above with reference to FIG. 8), the bus-side WBI waits for bus transactions, as indicated by block 1002 and the negative branch from decision block 1004. Similarly, the slave-side WBI waits for packets from the bus-side WBI, as indicated by block 1006 and the negative branch from decision block 1008. The bus Master can read from the slave device using a standard bus protocol. At block 1010, the bus master selects the slave device and sends a read command and address over the bus to the bus-side WBI controller. The WBI controller manages any protocol signaling, such as a handshake. The address is received by the WBI controller at block 1012. At block 1014, the WBI controller assembles a packet (with the structure shown in FIG. 6, for example) by prepending the preamble, packet type, and data length bits to the address. The data bits may be omitted, with the type field indicated a read request. Once the packet has been assembled, it is transmitted (preamble first) through the inductively-coupled link at block 1016. The bus-side WBI then waits for a response from the slave device as indicated by block 1018 and the negative branch from decision block 1020. When the packet is detected by the slave-side WBI, as depicted by the positive branch from decision block 1008, the packet is decided at block 1022 and data is read from the indicated address. At block 1024, a response packet is assembled, containing the read data, and the response packet is transmitted to the bus-side WBI at block 1026. When the response packet is detected at the bus-side WBI, as depicted by the positive branch from decision block 1020, the packet is decoded and the read data is forwarded, at block 1028, to the master device using the system bus. At block 1030, the master has received the requested read data and the transaction is complete. The slave may be powered-off if desired, or a further bus transaction may be initiated. In this manner, the master device does not distinguish between a wirelessly-coupled slave device and a wired slave device implemented in the same semiconductor die as the master device.

The slave-side WBI can be provided to slave device designers as a single IP (intellectual property) block to enable low-cost, highly flexible 3D integration. For example, a description of the slave-side WBI may be provided on non-transient computer readable medium containing computer-readable code for use in automated design and manufacture of the slave device. The code may include, for example, instructions of a hardware description language, a netlist of components and connections, or a mask for a semiconductor die.

Due to its wireless nature, customization using WBI can be performed with very little additional processing. Customization may be performed at an assembly stage rather than a fabrication stage. For example, a stacked 3D system may be constructed using a component placement system, such as a pick-and-place system, in combination with adhesive, to stack selected wireless slave dies and bond them to a bus/master semiconductor die or each other. Accurate location may be aided by fiducial markings or structures.

Using the scheme described above, wireless bus slaves can be addressed as if they were physically wired to the main system bus. Thus, after stacking, customization of the system can be completed in software alone. This contrasts with existing approaches that use application specific hardware to augment performance.

Figure 11:
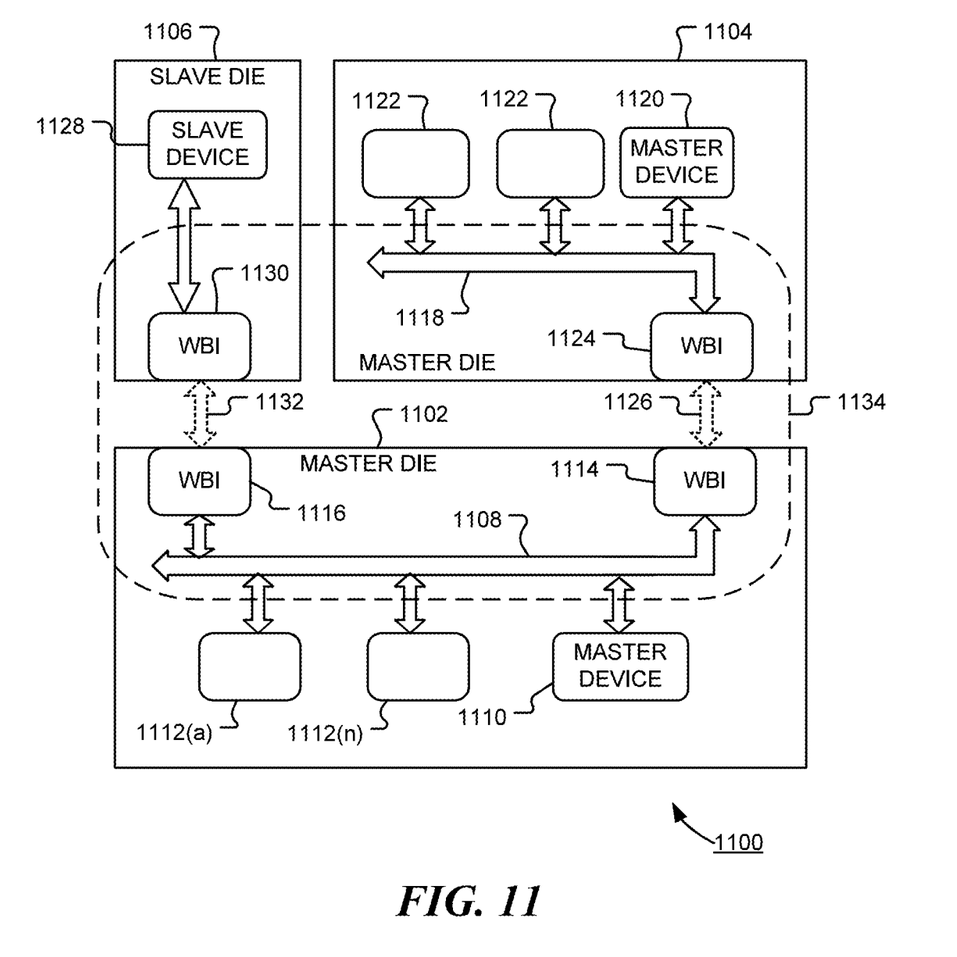
FIG. 11 is a further block diagram of a system-in-package (SiP) architecture, in accordance with various representative embodiments.

FIG. 11 is a further block diagram of a system-in-package (SiP) architecture, in accordance with various representative embodiments, that uses more than one master dies. In the embodiment shown, the chip-carrier package 1100 provides a data processing system that includes first master die 1102, second master die 1104 and a slave die 1106. A single slave die 1106 is shown in this simplified example, but additional slave dies may be included and may be wirelessly coupled to either master die. Master die 1102 includes integrated bus 1108 that is coupled to master device 1110 (such as a processor), one or more slave devices 1112(*a*) . . . (n) and bus-side WBIs 1114 and 1116. Similarly, master die 1104 includes integrated bus 1118 that is coupled to master device 1120, one or more slave devices 1122 and bus-side WBI 1124.

Bus-side WBIs are configured to be wirelessly coupled to provide wireless communication channel 1126 between integrated bus 1108 and integrated bus 1118.

Slave die 1106 includes slave device 1128 coupled to slave-side WBI 1130. Slave-side WBI 1130 is configured to be wirelessly coupled to bus-side WBI 1116 to provide wireless communication channel 1132 between master die 1102 and slave die 1106.

The bus-side and slave-side WBIs, together with the integrated busses, provide a system bus 1134 configured to exchange information between the master devices and between each master device and the slave device. System bus 1134 is distributed across multiple dies and enables the package of dies to operate as system-in-package (SiP).

Thus, in an embodiment of the disclosure, a chip-carrier package includes a data processing system having one or more slave dies, a master die and a system bus. Each slave die includes a slave device and a slave-side wireless bus interface (WBI) coupled to the slave device. The master die includes a master device, one or more bus-side WBIs coupled to the master device. Each bus-side WBI is configured to be wirelessly coupled to at least one slave-side WBI of the one or more slave dies and a system bus. The system bus includes one or more bus-side WBIs and the slave-side WBIs of the one or more slave-side dies. The system bus is configured to exchange information between the master device and the slave devices of the one or more slave dies.

The chip-carrier package may also include at least one additional master die that includes an additional master device and an additional bus-side WBI configured to be wirelessly coupled to a bus-side WBI the one or more bus-side WBIs of the master die, the system bus further including the additional bus-side WBI. The chip-carrier package may also include at least one additional master die that incorporates an additional master device and an additional bus-side WBI configured to be wirelessly coupled to at least one other bus-side or slave-side WBI and a system bus.

A slave die of the one or more slave dies may include a sensor, a memory, a peripheral device or a processor.

A bus-side WBI may include a transmitter inductor; a bus-side controller coupled to the master device and a transmission circuit coupled to the transmitter inductor and the bus-side controller. The transmission circuit is configured to supply a modulation signal to the transmitter inductor based on a data signal received from the master device via the bus-side controller.

A slave-side WBI may include a receiver inductor, a reception circuit, coupled to the receiver inductor, and a slave-side controller. The reception circuit is configured to demodulate and decode an electrical signal induced in the receiver inductor to generate received information. The slave-side controller is coupled to the reception circuit and the system bus and is configured to supply the received information to the slave device or a control register of the slave-side WBI.

In an embodiment, a master die is an integrated circuit die that includes a master device, an integrated bus, and a bus-side wireless bus interface (WBI), coupled to the master device via the integrated bus, including a transmitter inductor, a transmission circuit coupled to the transmitter inductor, and a controller coupled to the transmission circuit and the integrated bus, The bus-side WBI is configured to be wirelessly coupled to a slave-side WBI of a slave die to provide a system bus coupling the master device to a slave device of the slave die when the slave die is packaged with the integrated circuit die in a chip-carrier package. The bus-side WBI may also include a clock inductor and a clock circuit, coupled to the clock inductor. The clock circuit is configured to supply an electrical current to the clock inductor responsive to a clock signal. In addition the integrated circuit die is configured to supply power via the transmitter inductor or the clock inductor to the slave die when the slave die is packaged with the integrated circuit die in a chip-carrier package. The bus-side WBI may also include a receiver inductor and a reception circuit, coupled to the receiver inductor and the controller. The reception circuit is configured to generate a digital demodulated signal responsive to an electrical signal induced in the receiver inductor and the controller is further configured to transmit a signal to the system bus responsive to the digital demodulated signal generated by the reception circuit.

An embodiment of the disclosure implements method for transmitting data within a chip-carrier package that includes at least one master die and at least one slave die. The method, performed by a bus-side wireless bus interface (WBI) of a master die of the chip-carrier package, includes establishing a wireless communication channel between the bus-side WBI and one or more slave-side WBIs of the at least one slave die, configuring a system bus, including the wireless communication channel, to couple between the master device and one or more slave devices of the at least one slave die, the one or more slave devices coupled to the one or more slave-side WBIs, receiving data from a master device of the integrated circuit die and sending the data to a slave-side WBI of the one or more slave-side WBIs. The wireless communication channel may be established by sending a configuration message to the slave-side WBI via a wireless transmission channel of the wireless communication channel and receiving an acknowledgement of readiness message from the slave-side WBI via a wireless reception channel of the wireless communication channel.

In this document, relational terms such as first and second, top and bottom, and the like may be used solely to distinguish one entity or action from another entity or action without necessarily requiring or implying any actual such relationship or order between such entities or actions. The terms "comprises," "comprising," "includes," "including," "has," "having," or any other variations thereof, are intended to cover a non-exclusive inclusion, such that a process, method, article, or apparatus that comprises a list of elements does not include only those elements but may include other elements not expressly listed or inherent to such process, method, article, or apparatus. An element preceded by "comprises . . . a" does not, without more constraints, preclude the existence of additional identical elements in the process, method, article, or apparatus that comprises the element.

Reference throughout this document to "one embodiment," "certain embodiments," "an embodiment," "implementation(s)," "aspect(s)," or similar terms means that a particular feature, structure, or characteristic described in connection with the embodiment is included in at least one embodiment of the present disclosure. Thus, the appearances of such phrases or in various places throughout this specification are not necessarily all referring to the same embodiment. Furthermore, the particular features, structures, or characteristics may be combined in any suitable manner in one or more embodiments without limitation.

The term "or", as used herein, is to be interpreted as an inclusive or meaning any one or any combination. Therefore, "A, B or C" means "any of the following: A; B; C; A and B; A and C; B and C; A, B and C". An exception to this definition will occur only when a combination of elements, functions, steps or acts are in some way inherently mutually exclusive.

Numerous details have been set forth to provide an understanding of the embodiments described herein. The embodiments may be practiced without these details. In other instances, well-known methods, procedures, and components have not been described in detail to avoid obscuring the embodiments described. The disclosure is not to be considered as limited to the scope of the embodiments described herein.

Those skilled in the art will recognize that the present disclosure has been described by means of examples. The present disclosure could be implemented using hardware component equivalents such as special purpose hardware and/or dedicated processors which are equivalents to the present disclosure as described and claimed. Similarly, dedicated processors and/or dedicated hard wired logic may be used to construct alternative equivalent embodiments of the present disclosure.

Dedicated or reconfigurable hardware components used to implement the disclosed mechanisms may be described by computer readable code such as instructions of a hardware description language (HDL), such as VHDL, Verilog or RTL (Register Transfer Language), or by a netlist of components and connectivity. The computer readable code may also describe a semiconductor fabrication mask. The instructions may be at a functional level or a logical level or a combination thereof. The instructions or netlist may be input to an automated design or fabrication process (sometimes referred to as high-level synthesis) that interprets the instructions and creates digital hardware that implements the described functionality or logic.

The HDL instructions or the netlist may be stored on non-transient computer readable medium such as Electrically Erasable Programmable Read Only Memory (EEPROM); non-volatile memory (NVM); mass storage such as a hard disc drive, floppy disc drive, optical disc drive; optical storage elements, magnetic storage elements, magneto-optical storage elements, flash memory, core memory and/or other equivalent storage technologies without departing from the present disclosure. Such alternative storage devices should be considered equivalents.

Various embodiments described herein may be implemented using dedicated hardware, configurable hardware or programmed processors executing programming instructions that are broadly described in flow chart form that can be stored on any suitable electronic storage medium or transmitted over any suitable electronic communication medium. A combination of these elements may be used. Those skilled in the art will appreciate that the processes and mechanisms described above can be implemented in any number of variations without departing from the present disclosure. For example, the order of certain operations carried out can often be varied, additional operations can be added or operations can be deleted without departing from the present disclosure. Such variations are contemplated and considered equivalent.

The various representative embodiments, which have been described in detail herein, have been presented by way of example and not by way of limitation. It will be understood by those skilled in the art that various changes may be made in the form and details of the described embodiments resulting in equivalent embodiments that remain within the scope of the appended claims.

What is claimed is:

1. A chip-carrier package, comprising:
   a data processing system including:
   a master die; and
   a tier, stacked on the master die, including a first slave die and a second slave die arranged horizontally within the tier;
   the first slave die including a first slave device and a first slave-side wireless bus interface (WBI) coupled to the first slave device, where the first slave device is a memory;
   the second slave die including a second slave device and a second slave-side WBI coupled to the second slave device, where the second slave device is a sensor including a transducer configured to transmit and receive radio frequency (RF) signals, the transducer being a microelectromechanical system (MEMS) radar transducer; and
   the master die including:
   a master device;
   a system bus coupled to the master device;
   a first bus-side WBI, coupled to the system bus, configured to establish a first wireless link to the first slave-side WBI to exchange data between the master device and the memory; and a second bus-side WBI, coupled to the system bus, configured to establish a second wireless link to the second slave-side WBI to exchange data between the master device and the sensor.

2. The chip-carrier package of claim 1, where the memory is a flash memory.

3. The chip-carrier package of claim 1, where at least one slave die and the master die are fabricated using different technologies.

4. The chip-carrier package of claim 1, where each bus-side WBI includes one or more inductors, one or more capacitors, or a combination thereof.

5. The chip-carrier package of claim 1, where each slave-side WBI includes one or more inductors, one or more capacitors, or a combination thereof.

6. The chip-carrier package of claim 1, where:
each bus-side WBI includes:
  a transmitter inductor;
  a bus-side controller coupled to the master device via the system bus;
  a transmission circuit coupled to the transmitter inductor and the bus-side controller, configured to supply a modulation signal to the transmitter inductor based on a data signal received from the master device via the bus-side controller and the system bus, and
each slave-side WBI includes:
  a receiver inductor;
  a reception circuit, coupled to the receiver inductor, configured to demodulate and decode an electrical signal induced in the receiver inductor to generate received information; and
  a slave-side controller, coupled to the reception circuit and the slave device, configured to supply the received information to the slave device or a control register of the slave-side WBI.

7. The chip-carrier package of claim 6, where:
each bus-side WBI includes:
  a clock transmitter inductor; and
  a clock transmission circuit, coupled to the clock transmitter inductor, configured to supply an electrical current to the clock transmitter inductor responsive to a clock signal, and
each slave-side WBI includes:
  a clock receiver inductor; and
  a clock receiver circuit, coupled to the clock receiver inductor, configured to generate a received clock signal based at least in part on an electrical current induced in the clock receiver inductor.

8. The chip-carrier package of claim 7, where the master die is configured to supply power to each slave die via the respective transmitter inductor or clock inductor.

9. The chip-carrier package of claim 1, where:
each slave device is configured to generate slave data;
each bus-side WBI of the master die includes:
  a receiver inductor;
  a reception circuit, coupled to the receiver inductor, configured to generate a digital demodulated signal responsive to an electrical signal induced in the receiver inductor; and
  a bus-side controller, coupled to the reception circuit, configured to transmit a signal to the master device responsive to the digital demodulated signal generated by the reception circuit; and
each slave-side WBI includes:
  a transmitter inductor;
  a slave-side controller configured to receive slave data; and
  a transmission circuit, coupled to the transmitter inductor and the slave-side controller, configured to generate a modulation signal based at least in part on the slave data received via the slave-side controller.

10. An integrated circuit die including:
a master device;
an integrated bus coupled to the master device;
a first bus-side wireless bus interface (WBI), coupled to the master device via the integrated bus, including a transmitter inductor, a transmission circuit coupled to the transmitter inductor, a bus slave interface, and a controller coupled to the transmission circuit and coupled, via the bus slave interface, to the integrated bus; and
a second bus-side WBI, coupled to the master device via the integrated bus, including a transmitter inductor, a transmission circuit coupled to the transmitter inductor, a bus slave interface, and a controller coupled to the transmission circuit and coupled, via the bus slave interface, to the integrated bus,
where the bus slave interface is configured to route bus messages with a designated address to the controller of the bus-side WBI,
where the first bus-side WBI is configured to:
  establish a first wireless link to a first slave-side WBI of a first slave die to couple the master device to a first slave device of the first slave die when the first slave die is packaged with the integrated circuit die in a chip-carrier package, where the first slave device is a memory;
  form an information packet from a bus message routed to the controller of the first bus-side WBI by the bus slave interface, and
  transmit the information packet to the first slave-side WBI of the first slave die via the first wireless link, and
where the second bus-side WBI is configured to:
  establish a second wireless link to a second slave-side WBI of a second slave die to couple the master device to a second slave device of the second slave die when the second slave die is packaged with the first slave die and the integrated circuit die in the chip-carrier package, where the second slave device is a sensor that includes a transducer configured to transmit and receive radio frequency (RF) signals, the transducer being a microelectromechanical system (MEMS) radar transducer, and where the first and second slave dies are arranged horizontally within a tier of the chip-carrier package,
  form an information packet from a bus message routed to the controller of the second bus-side WBI by the bus slave interface, and
  transmit the information packet to the second slave-side WBI of the second slave die via the second wireless link.

11. The integrated circuit die of claim 10, where each bus-side WBI includes a clock inductor and a clock circuit, coupled to the clock inductor, configured to supply an electrical current to the clock inductor responsive to a clock signal.

12. The integrated circuit die of claim 11, where the integrated circuit die is configured to supply power via the transmitter inductor or the clock inductor to the slave die when each slave die is packaged with the integrated circuit die in a chip-carrier package.

13. The integrated circuit die of claim 12, where each bus-side WBI includes:

a receiver inductor; and a reception circuit, coupled to the receiver inductor and the controller, configured to generate a digital demodulated signal responsive to an electrical signal induced in the receiver inductor, where the controller is configured to transmit a signal to the system bus responsive to the digital demodulated signal generated by the reception circuit.

14. The integrated circuit die of claim 12, where: the memory is a flash memory.

15. A non-transient computer readable medium containing computer-readable code descriptive of the apparatus of claim 10.

\* \* \* \* \*